United States Patent [19]
Shimizu et al.

[11] Patent Number: 5,291,060
[45] Date of Patent: Mar. 1, 1994

[54] LEAD FRAME AND SEMICONDUCTOR DEVICE USING SAME

[75] Inventors: Mitsuharu Shimizu, Nagano; Yoshiki Takeda, Iiyama; Hirofumi Fujii, Nagano, all of Japan

[73] Assignees: Shinko Electric Industries Co., Ltd., Nagano, Japan; Intel Corp., Santa Clara, Calif.

[21] Appl. No.: 984,841

[22] Filed: Dec. 3, 1992

Related U.S. Application Data

[63] Continuation of Ser. No. 803,724, Dec. 9, 1991, Pat. No. 5,237,202.

[30] Foreign Application Priority Data

Oct. 16, 1989 [JP] Japan ................. 1-268649
Feb. 6, 1990 [JP] Japan ................. 02-26786

[51] Int. Cl.⁵ .............................. H01L 23/48
[52] U.S. Cl. ....................... 257/667; 257/672; 257/676
[58] Field of Search .............. 257/667, 672, 676

[56] References Cited

U.S. PATENT DOCUMENTS

| | | | |
|---|---|---|---|
| 4,796,078 | 1/1989 | Phelps Jr. et al. | 357/68 |
| 4,805,009 | 2/1989 | Pryor et al. | 357/70 |
| 4,891,687 | 1/1990 | Mallik et al. | 357/70 |
| 4,965,654 | 10/1990 | Karner et al. | 357/70 |
| 5,175,060 | 12/1992 | Enomoto et al. | 257/672 |

Primary Examiner—Edward Wojciechowicz
Attorney, Agent, or Firm—Staas & Halsey

[57] ABSTRACT

A multi7layer lead frame is provided with a lead frame body made of a metal strip and having a plurality of inner leads including respective tips which define an opening. A power supply metal plane is adhered to the inner leads and a ground metal plane is adhered to the power supply metal plane by insulative adhesive layers. These metal planes are provided with first wire bonding areas and through holes in the vicinity thereof. A semi7conductor device comprises such a multi7layer lead frame, a semiconductor chip mounted on a stage thereof, bonding-wires electrically connecting the chip to the areas, and a resin integrally molding the multi7layer lead frame, the chip, and the bonding-wires in such a manner that the through holes are filled with the resin.

20 Claims, 3 Drawing Sheets

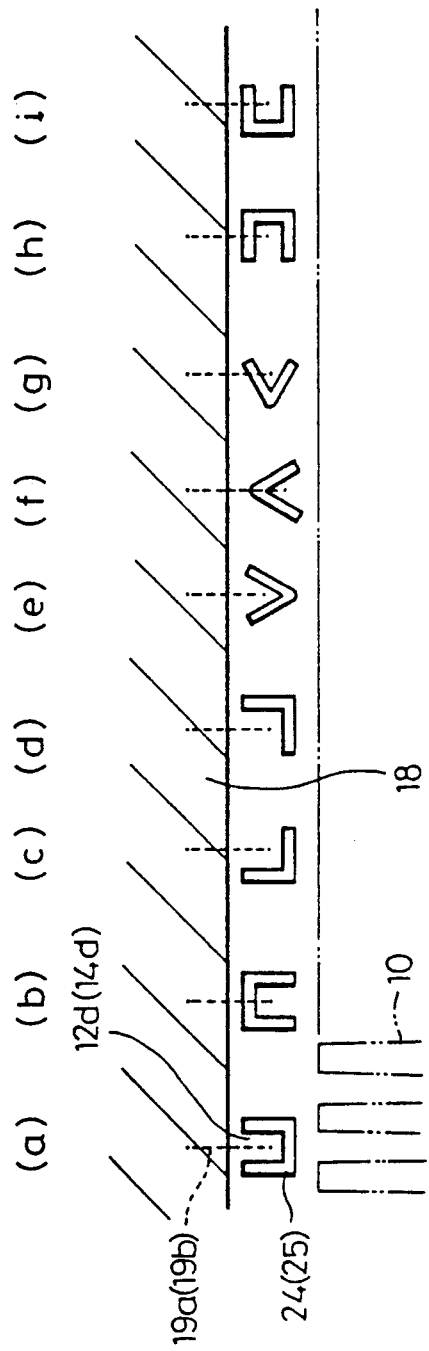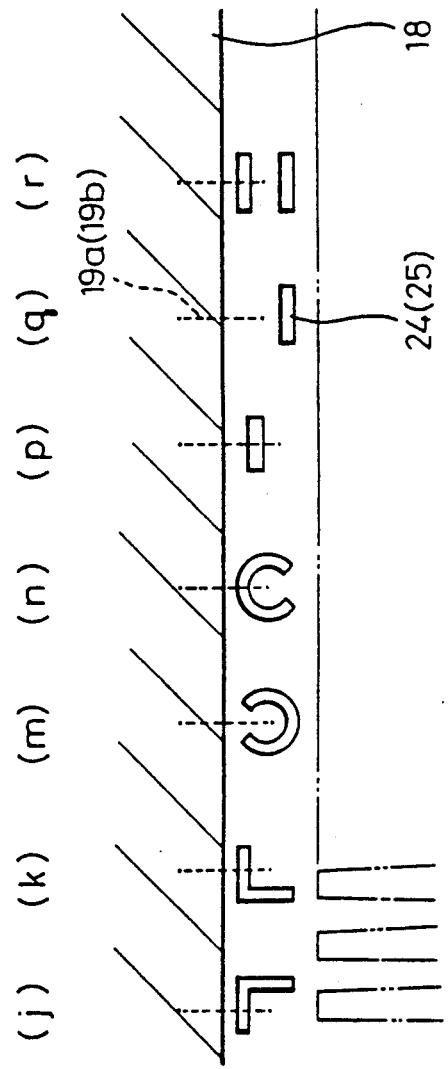

LEAD FRAME AND SEMICONDUCTOR DEVICE USING SAME

This application is a continuation of application Ser. No. 07/803,724, filed Dec. 9, 1991, now U.S. Pat. No. 5,237,202.

BACKGROUND OF THE INVENTION

1. Field of the Invention

This invention relates to a lead frame and, more particularly to a multi-layer lead frame having at least one metal plate or plane, hereinafter referred to as "metal plane" and used for a semiconductor device. This invention also relates to a semiconductor device using such a multi-layer lead frame.

2. Description of the Related Art

A conventionally known multi-layer lead frame for a semiconductor device comprises at least one metal plate or plane connected via an insulative layer to the bottom surfaces of inner leads. The use of such a multi-layer lead frame enables the mounting of a relatively power-consumable semiconductor chip on the metal plane, due to a heat radiation of the metal plane. Also, the metal plane can be used as a ground layer or a power supply layer, to thereby improve the electrical characteristics of the semiconductor device.

FIG. 4 shows a conventionally known semiconductor device using such a multi-layer lead frame. In this example, two metal planes, i.e., a power supply metal plane 12 located under the inner leads 10 and a ground metal plane 14 located under the power supply metal plane 12, are used. These metal plane 12 and 14 are fixed to the inner leads 10 and the plane 12, respectively, by insulative layers 16 and 16a, respectively, made of, for example, a polyimide. The power supply metal plane 12 and the ground metal plane 14 are electrically connected to power supply lines and ground lines, respectively, of the inner leads. The lead frame including the inner leads 10 and metal plane 12 and 14, and a semiconductor chip 18 mounted on the ground metal plane 14, are hermetically sealed or molded with a resin 30.

In such a resin molded type semiconductor device, however, if the temperature of the device becomes to high, the molded resin is easily peeled from a stage portion of the metal plane on which a semiconductor chip is mounted, and cracks might appear in the molded resin. To prevent the generation of such cracks in the molded resin, the stage portion is provided beforehand with many dimples, notches, or through holes, to thereby improve the adhesion between the molded resin and the stage portion. Alternatively, the stage portion is provided with slits or recesses to prevent an ingress water or the like to the molded resin, which might come into contact with the semiconductor chip. In a multi-layer lead frame, however, since the stage (in this case, the metal plate) is much larger than a stage portion of usual flat type or single-layer lead frame, the water component contained in the molded resin might be expanded when the semiconductor device is subjected to a soldering process or when the semiconductor chip generates heat, and such an expansion of the water component in the molded resin might cause stress therein, and cause cracks to appear in the molded resin.

In addition, in a multi-layer lead frame, since the metal plane is fixed to the inner leads by an insulative layer 16, to effect an electrical insulation therebetween, an adhesive material, such as a polyimide, used as the insulative layer 16 is generally hygroscopic and, therefore, easily causes cracks to appear in the molded resin.

Particularly, the coefficient of thermal expansion of the resin is generally larger than that of the metal plane, and therefore, the molded resin might be peeled from the metal plane (in particular, a central portion of the metal plane), under a high temperature condition, due to a difference in the coefficients of thermal expansion of the resin and metal plane.

Also, because a wire-bonding onto the metal plane usually occurs in the vicinity of the semiconductor chip, a stress to which the wire-bonding area of the metal plane is subjected is larger than that at a wire-bonding area of the top surfaces of the inner leads. Therefore, a strength of the bonding connection might be weakened, and thus the bonded-wire easily peeled from the metal plane. Therefore, if the bonding-area is repeatedly subjected to stress, the molded resin might be peeled from the metal plane and the bonded-wire might be also easily peeled from, and therefore disconnected from, the metal plane.

SUMMARY OF THE INVENTION

An object of the present invention is to provide a multi-layer lead frame and a semiconductor device using such a multi-layer lead frame, in which a strength of an adhesion or bonding between the lead frames and the molded resin is improved, and a peeling of the bonded wire from the metal plate at the wire-bonding area is prevented.

According to this invention, there is provided a multi-layer lead frame for a semiconductor device comprising: a lead frame body made of a metal strip and having an opening and a plurality of inner leads, the inner leads having respective tips which define at least a part of the opening; at least one metal plane which is independent from the lead frame body, the metal plane being adhered to the inner leads by an insulative adhesive layer and being provided with wire bonding areas and holes in the vicinity of the wire bonding areas.

In another aspect of this invention, there is provided a semiconductor device comprising: (a) a multi-layer lead frame for a semiconductor device comprising: a lead frame body made of a metal strip and having an opening and a plurality of inner leads, the inner leads having respective tips which define at least a part of the opening; at least one metal plane, which is independent from the lead frame body, the metal plane being adhered to the inner leads by an insulative adhesive layer; and the being provided with a stage portion, wire bonding areas and holes in the vicinity of the wire bonding areas; (b) a semiconductor chip mounted on the stage portion; (c) bonding-wires electrically connecting the semiconductor chip to the wire bonding areas of the metal plane; and (d) a resin hermetically and integrally molding at least a part of the multi-layer lead frame, the semiconductor chip, and the bonding-wires, in such a manner that the holes are also filled with the resin.

Thus, according to the present invention, the multi-layer lead frame has a plurality of holes which are filled with the molded resin, whereby a strength of an adhesion or bonding between the lead frames and the molded resin is improved and a peeling of the bonded-wires from the metal plane at the wire-bonding areas is prevented.

BRIEF DESCRIPTION OF THE DRAWINGS

FIGS. 5A and 5B are enlarged plan views showing various shapes of through holes.

DESCRIPTION OF THE PREFERRED EMBODIMENTS

Figure 1:
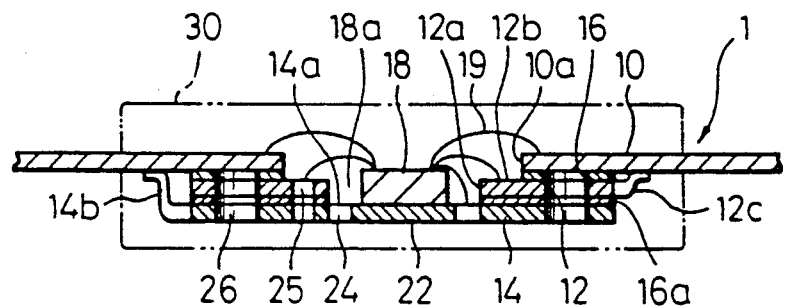
FIG. 1 is a cross-sectional view of a semiconductor device according to the present invention.
Figure 2:
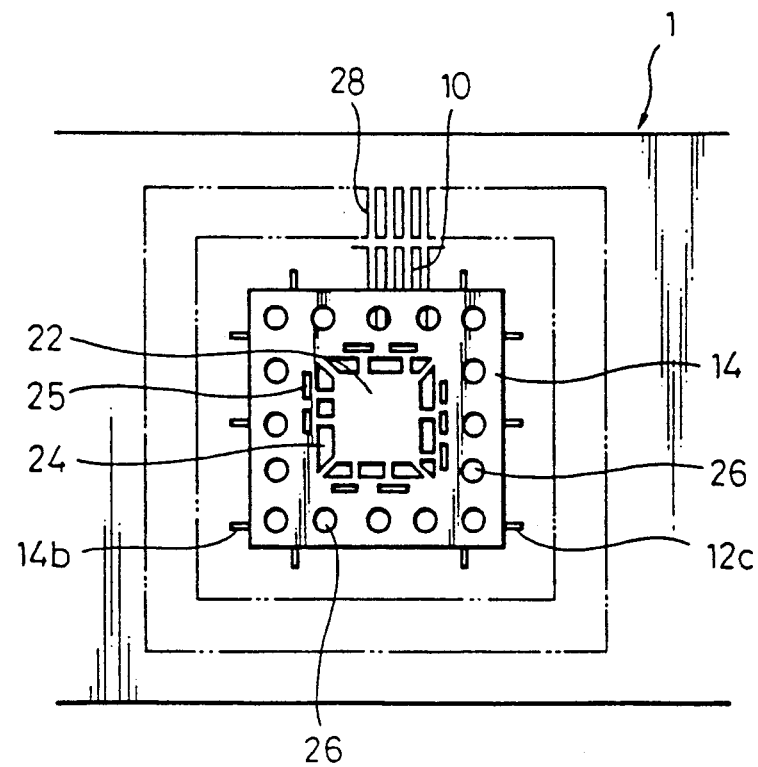
FIG. 2 is a bottom plan view of the multi-layer lead frame used in the semiconductor device as shown in FIG. 1.
Figure 3:
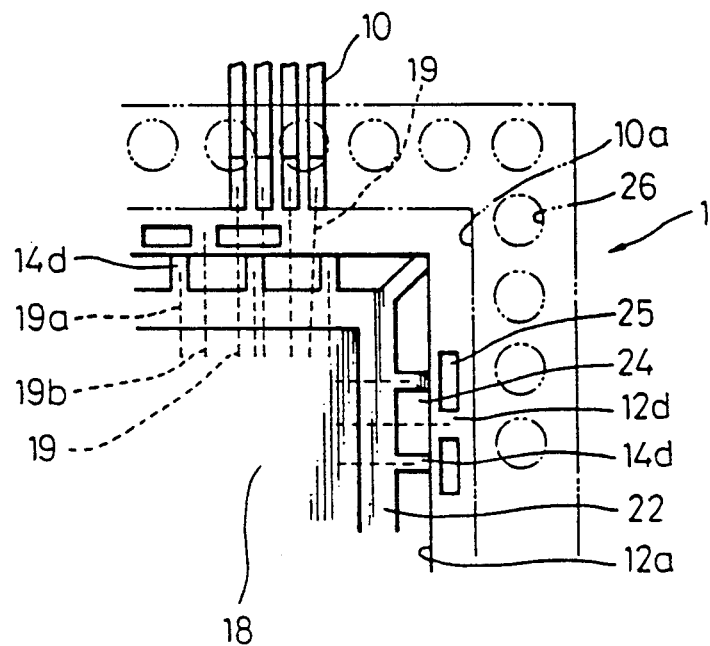
FIG. 3 is an enlarged plan view showing the arrangement of a semiconductor chip, a power supply metal plane, and a ground metal plane.
Figure 4:
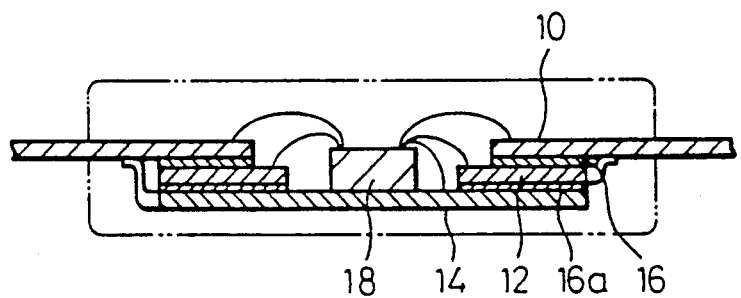
FIG. 4 is a cross-sectional view of a semiconductor device using a known multi-layer lead frame.

Referring now to the drawings, FIGS. 1, 2 and 3 show a preferred embodiment of a multi-layer lead frame used in a semiconductor device according to the present invention. In FIGS. 1 and 2, a multi-layer lead frame generally indicated by a reference numeral 1 comprises, in the same manner as the conventionally known semiconductor device as shown in FIG. 4, two metal plane, i.e., a power supply metal plane 12 located under inner leads 10 and a ground metal plane 14 located under the power supply metal plane 12. These metal plane 12 and 14 are fixed to inner leads 10 and the metal plane 12, respectively, by adhesive insulative layers 16 and 16a, respectively, made of, for example, a polyimide.

The power supply metal plane 12 has a rectangular opening 12a at a central portion thereof, defining a stage portion 22 on the ground metal plane 14 on which a semiconductor chip 18 is mounted. Also, the inner tops of the inner leads 10 define a rectangular opening 10a which is larger than the rectangular opening 12a of the power supply metal plane 12. Therefore, a wire-bonding section 12b of the power supply metal plane 12 is defined by the periphery of the rectangular opening 10a of the inner leads 10. In the same manner, a wire-bonding section 14a of the ground metal plane 14 is defined by the periphery of the stage portion 22 and the inner periphery of the rectangular opening 12a of the power supply metal plane 12. Therefore, these bonding sections (or wire-bonding areas, as mentioned later) can be easily connected to terminals of the semiconductor chip 18 via bonding-wires 19.

The power supply metal plane 12 is electrically connected to power supply lines of the inner leads 10 by a plurality of soldered connecting points 12c. In the same manner, the ground metal plane 14 is electrically connected to ground lines of the inner leads 10 by a plurality of soldered connecting points 14b. These soldered connecting points 12c and 14b are integral parts of the power supply metal plane 12 and the ground metal plane 14, respectively, as projections protruded from the outer peripheries thereof, and thus the power supply metal plane 12 and the ground metal plane 14 function as a common power supply station and a common ground station, respectively.

In an embodiment of the multi-layer lead frame according to the present invention, the ground metal plane 14 is provided with a plurality of through holes 24 at the periphery of the stage portion 22, i.e., the bonding section 14a thereof. The bonding section 12b of the power supply metal plane 12 is also provided with a plurality of through holes 25, each of the through holes 25 penetrating both the power supply metal plane 12 and the ground metal plane 14, as well as the insulative layer 16a between the metal plane 12 and 14. In addition, another plurality of through holes 26 is provided under the inner leads, each of these through holes 26 penetrating both the power supply metal plane 12 and the ground metal plane 14, as well as the insulative layers 16 and 16a between the inner leads 10 and the power supply metal plane 12 and between the metal plane 12 and the ground metal plane 14, respectively.

FIG. 2 is a bottom plan view of the multi-layer lead frame 1, and therefore, the top portions of the inner leads 10 can not be seen, since these portions are covered by the ground metal plane 14 and other elements. As shown in FIG. 2, the through holes 26 are equidistantly spaced from one another. The stage portion 22 is located at the central area of the rectangular ground metal plane 14.

As shown in FIG. 3, in the wire-bonding section 14b enclosing the periphery of the stage portion 22, the through holes 24 are arranged regularly to define wire-bonding areas 14d between these through holes 24, each area 14d having substantially the same width as the width of the inner leads 10. Consequently, the through holes 24 are located at the respective sides of the wire-bonding areas 14d, or at one side thereof. Similarly, in the wire-bonding section 12a on the power supply metal plane 12, the through holes 25 are arranged between regularly to define wire-bonding areas 12d between these through holes 25. Consequently, the through holes 25 are located at the respective sides of the wire-bonding areas 12d or at one side of thereof.

Preferably, each of the through holes 26 has a size sufficient to cross two adjacent inner leads 10, so that the holes 26 are filled with the sealed resin via the gaps between the inner leads 10.

The wire-bonding areas 12a and 14a are electrically connected to the terminals (i.e., power supply terminals and ground terminals, respectively) of the semiconductor chip 18 by a plurality of bonding wires 19a and 19b, respectively. The inner leads 10 are also electrically connected to the terminals (i.e., signal terminals) of the semiconductor chip 18 by a plurality of bonding wires 19.

After the semiconductor chip 18 is fixedly mounted on the stage portion 22 and the inner leads 10, the power supply metal plane 12, and the ground metal plane 14 are connected to the semiconductor chip 18 by the bonding wires 19, 19a and 19b, these members are hermetically sealed or molded with a resin 30, whereby a semiconductor device according to the present invention is obtained.

When using a multi-layer lead frame having through holes 24, 25, and 26 as mentioned above, these through holes 24, 25, and 26 are filled with the molded resin 30, so that a strength of the adhesion or bonding between the lead frames and the molded resin is improved and a peeling of the bonded wires from the metal plate at the wire-bonding area is prevented. Particularly, the power supply metal plane 12 and the ground metal plane 14 are strongly adhered to the molded resin in the vicinity of the wire bonding areas 12d and 14d, respectively, as the wire bonding areas 12d and 14d are sandwiched between the through holes 25 and 24, respectively.

The through holes 25 and 24 can be provided at only one side of the bonding areas 12d and 14d, respectively, but similar effects can be obtained. Nevertheless, it is better to provide the through holes 25 and 24 at the respective sides of the bonding areas 12d and 14d, respectively, to obtain a greater advantage therefrom.

With respect to the inner leads 10, since the through hole 26 has a size sufficient to cross two adjacent inner leads 10, so that the holes 26 are filled with the sealed resin via the gaps between the inner leads 10, as mentioned above, the molded resin is mutually communicated between the upper and lower surfaces of the inner leads 10, so that a strength of the adhesion or bonding between the inner leads 10 and the molded resin 30 is improved, and thus the inner leads 10 are more firmly fixed to the resin 30, and therefore, a peeling of the bonded wires 19 from the inner leads 10 is prevented. In the above-mentioned embodiment, although the bonding sections 12b and 14a of the power supply metal plane 12 and the ground metal plane 14 are provided with the through holes 25 and 24, respectively, only one thereof can be provided with such through holes, since the bonding sections 12b and 14a are arranged relatively near to each other. If only the power supply metal plane 12 is provided with the through holes 25, preferably the through holes 25 penetrate both the power supply metal plane 12 and the ground metal plane 14.

Also, the shapes of the through holes 24 and 25 may be selected as desired; variations or embodiments of the shapes of the through hole 25 are shown in FIG. 5.

In FIG. 5A, the embodiments (a), (b), (h) and (i) show U-shaped holes 24 (25) opened toward the semiconductor chip 18, the inner leads 10, the left side, and the right side, respectively, each embracing the wire bonding area 12d (14d). The embodiments (c), (d), and in FIG. 5B (j) and (k) show L-shaped holes 24 (25). The embodiments (e), (f) and (g) in FIG. 5A show V-shaped holes 24 (25) opened toward the semiconductor chip 18, the inner leads 10, and the side, respectively. The embodiments (m) and (n) in FIG. 5 show arch-shaped hole 24 (25) opened toward the semiconductor chip 18 and the inner leads 10, respectively. In FIG. 5B the embodiments (p), (q) and (r) show small slit-like holes 24 (25) extending in parallel to the periphery of the semiconductor chip 18, in which the embodiments (p), (q) and (r) are the front, behind, and both the front and behind of the wire-bonding area 12d (14d), respectively.

It appears that the embodiment (a) is most advantageous, since the U-shaped hole 24 (25) is opened toward the semiconductor chip 18, i.e., toward the bonded-wire 19a (19b), and if any tension is exerted on the bonded-wire 19a (19b), such a tension is resiliently absorbed by a lip-shaped piece defined by the U-shaped hole, and therefore, a peeling of the bonded-wire from the bonding area is prevented. In the embodiment (b), such a tension is also resiliently absorbed by the U-shaped hole.

It should be understood by those skilled in the art that the foregoing description relates to only preferred embodiments of the disclosed invention, and that various changes and modifications may be made to the invention without departing from the spirit and scope thereof. For example, in the above embodiment, the multi-layer lead frame has two metal plane, i.e., a power supply metal plane 12 and a ground metal plane 14, but this invention can be also applied to a multi-layer lead frame having one metal layer or more than two metal layers.

Thus, with the multi-layer lead frame according to the present invention, or the semiconductor device using such a multi-layer lead frame, a strength of adhesion or bonding between the lead frames and the molded resin is improved and a peeling of the bonded-wire from the metal plane at the wire-bonding area thereof is prevented.

We claim:

1. A multi-layer lead frame for at least one semiconductor chip comprising:

a lead frame body made of a metal strip and having an opening and a plurality of inner leads, said inner leads having respective tips which define at least a part of said opening;

a metal plane which is independent from said lead frame body, has top and bottom planar surfaces and is electrically connected to one of said inner leads at a connecting point, said metal plane having wire bonding areas for connection to the semiconductor chip and inner holes formed int he metal plane and located beside said wire bonding areas within said opening; and an insulative adhesive layer adhering said top planar surface to said inner leads.

2. A multi-layer lead frame as set forth in claim 1, wherein said opening is covered by said metal plane.

3. A multi-layer lead frame according to claim 1, further comprising bonding wires bonded to said metal plane at said wire bonding areas and connectable to provide one of power supply and ground connections for the semiconductor device.

4. A multi-layer lead frame according to claim 1, wherein said metal plane has outer holes formed therein along an outer periphery of said metal plane.

5. A multi-layer lead frame according to claim 4, wherein said outer holes comprise round holes 6. A multi-layer lead frame according to claim 1, further comprising molded resin filled within each inner hole and encapsulating the semiconductor device.

7. A multi-layer lead frame according to claim 1, wherein said inner holes comprise slit-like through holes.

8. A multi-layer lead frame according to claim 1, wherein said inner holes comprise L-shaped through holes.

9. A multi-layer lead frame according to claim 1, wherein said inner holes comprise one of U, V and C-shaped through holes.

10. A multi-layer lead frame for at least one semiconductor chip comprising:

a lead frame body made of a metal strip and having an opening and a plurality of inner leads, said inner leads having respective tips which define at least a part of said opening;

a metal plane which is independent from said lead frame body and has top and bottom planar surfaces, said metal plane having wire bonding areas and inner holes formed in the metal plane and located beside said wire bonding areas within said opening; and an insulative adhesive layer adhering said top planar surface to said inner leads.

11. A multi-layer lead frame as set forth in claim 10, wherein said opening is covered by said metal plane.

12. A multi-layer lead frame according to claim 10, further comprising bonding wires bonded to said metal plane at said wire bonding areas and connectable to provide one of power supply and ground connections for the semiconductor device.

13. A multi-layer lead frame according to claim 10, wherein said metal plane has outer holes formed therein along an outer periphery of said metal plane.

14. A multi-layer lead frame according to claim 13, wherein said outer holes comprise round holes.

15. A multi-layer lead frame according to claim 10, further comprising molded resin filled within each inner hole and encapsulating the semiconductor chip.

16. A multi-layer lead frame according to claim 10, wherein said inner holes comprise through holes.

17. A multi-layer lead frame according to claim 10, wherein said inner holes comprise slit-like through holes.

18. A multi-layer lead frame according to claim 10, wherein said inner holes comprise L-shaped through holes.

19. A multi-layer lead frame according to claim 10, wherein said inner holes comprise one of U, V and C-shaped through holes.

20. A semiconductor device comprising:
(a) a multi-layer lead frame for a semiconductor device comprising:
a lead frame body made of a metal strip and having an opening and a plurality of inner leads, said inner leads having respective tips which define at least a part of said opening;
a metal plane which is independent from said lead frame body and has top and bottom planar surfaces, said metal plane having a stage portion, wire bonding areas at a peripheral portion of said stage portion within said opening and through holes formed in said metal plane and located beside said wire bonding areas; and
an insulative adhesive layer adhering said top planar surface to said inner leads;
(b) a semiconductor chip mounted on said stage portion;
(c) bonding-wires electrically connecting said semiconductor chip to said wire bonding areas of said metal plane; and
(d) a resin hermetically and integrally molding at least a part of said multi-layer lead frame, said semiconductor chip, and said bonding-wires in such a manner that said through holes are also filled with said resin.

* * * * *

UNITED STATES PATENT AND TRADEMARK OFFICE
CERTIFICATE OF CORRECTION

PATENT NO. :    5,291,060
DATED      :    March 1, 1994
INVENTOR(S) :   MITSUHARU SHIMIZU It is certified that error appears in the above-indentified patent and that said Letters Patent is hereby corrected as shown below:

TITLE PAGE:

In the Abstract [57]

line 1, "multi7layer" should be --multi-layer--;

line 8, "semi7" should be --semi- --;

line 9, "multi7layer" should be --multi-layer--;

line 12, "multi7" should be --multi- --.

Column 6, line 32, after "holes", insert --.--

Signed and Sealed this

Sixth Day of December, 1994

Attest:

BRUCE LEHMAN

*Attesting Officer*    *Commissioner of Patents and Trademarks*